United States Patent
Fu et al.

(10) Patent No.: US 7,221,140 B2
(45) Date of Patent: May 22, 2007

(54) CIRCUIT, METHOD AND SYSTEM FOR PROVIDING ONE OR MORE PHASE VOLTAGES FROM INPUT VOLTAGES

(75) Inventors: Minghua Fu, Plano, TX (US); Joao Andres, Mesquite, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 413 days.

(21) Appl. No.: 10/801,728

(22) Filed: Mar. 16, 2004

(65) Prior Publication Data

US 2005/0207198 A1 Sep. 22, 2005

(51) Int. Cl.
*G01R 25/00* (2006.01)
(52) U.S. Cl. ......................................... 324/86
(58) Field of Classification Search .................. 324/86; 363/148
See application file for complete search history.

(56) References Cited

U.S. PATENT DOCUMENTS

| 4,249,124 A | * | 2/1981 | De Mesmaeker | 324/521 |
| 4,366,521 A | * | 12/1982 | Jessee | 361/76 |
| 4,901,005 A | * | 2/1990 | Shin et al. | 324/86 |
| 4,933,630 A | * | 6/1990 | Dupraz | 324/107 |
| 6,529,013 B2 | * | 3/2003 | Skendzic et al. | 324/628 |

* cited by examiner

*Primary Examiner*—Vincent Q. Nguyen

(57) ABSTRACT

The present invention provides a phase voltage circuit. In one embodiment, the phase voltage circuit includes a line voltage stage coupled to at least three input voltage lines and configured to provide at least two corresponding line voltages. Additionally, the phase voltage circuit also includes a difference voltage stage coupled to the line voltage stage and configured to provide at least one phase voltage from the at least two corresponding line voltages.

21 Claims, 6 Drawing Sheets

CIRCUIT, METHOD AND SYSTEM FOR PROVIDING ONE OR MORE PHASE VOLTAGES FROM INPUT VOLTAGES

TECHNICAL FIELD OF THE INVENTION

The present invention is directed, in general, to power circuits and, more specifically, to a circuit, method and system for providing one or more phase voltages from input voltage lines not having a neutral line.

BACKGROUND OF THE INVENTION

In a three phase alternating current (AC) system, knowledge of the phase voltages is often required for various control purposes. Because a neutral line is rarely available, the phase voltage is often defined with respect to a virtual neutral point. This virtual neutral point is usually established as the intersection of three equal impedances coupled to respective ones of the voltage lines.

In practice, inverting operational amplifiers ("opamps") may be employed to provide an estimate of a scaled value of each phase voltage. The positive input of each of the opamps is referenced to a signal (isolated) ground. In power converters, this signal ground is often the converter ground bus. Unfortunately, a common mode voltage can develop between the virtual neutral point and the signal ground. This common mode voltage can grow to the point that one or more of the opamps fails to indicate accurate line voltages.

The common mode voltage may be reduced by placing an impedance between the virtual neutral point and the signal ground. However, this distorts the virtual neutral point, and the outputs of the inverting amplifiers may no longer accurately reflect the phase voltages.

To resolve a large common mode voltage swing in a switching environment, an isolation transformer or an opto-coupler may be employed with the opamps. The transformer can provide excellent isolation and good linearity, but often its size is a problem as requirements for power converters dictate smaller footprints and higher power density. While opto-couplers provide smaller size, the non-linearity inherent in opto-couplers degrades the accuracy of the voltage measurement. Furthermore, the added isolation may require an isolated bias supply for the power converter, posing additional cost or surface area requirements. Other solutions may work well for a symmetric or balanced voltage condition. However, these solutions usually do not accommodate line voltages that are asymmetric or unbalanced, which is more often the case in real-world environments.

Accordingly, what is needed in the art is an improved way to provide phase voltages from voltage lines that lack a neutral line and that accommodates voltage imbalances.

SUMMARY OF THE INVENTION

To address the above-discussed deficiencies of the prior art, the present invention provides a phase voltage circuit. In one embodiment, the phase voltage circuit includes a line voltage stage coupled to at least three input voltage lines and configured to provide at least two corresponding line voltages. The phase voltage circuit also includes a difference voltage stage coupled to the line voltage stage and configured to provide at least one phase voltage from the at least two corresponding line voltages.

In another aspect, the present invention provides a method of providing at least one phase voltage. The method includes initially providing at least two corresponding line voltages from at least three input voltage lines and subsequently providing the at least one phase voltage from the at least two corresponding line voltages.

The present invention also provides, in yet another aspect, a phase voltage system for measuring three-phase voltages. The phase voltage system includes three input voltage lines and a phase voltage circuit. The phase voltage circuit has a line voltage stage, coupled to the three input voltage lines, that provides three corresponding line voltages. The phase voltage circuit also has a difference voltage stage, coupled to the line voltage stage, that provides three corresponding phase voltages from the three corresponding line voltages.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
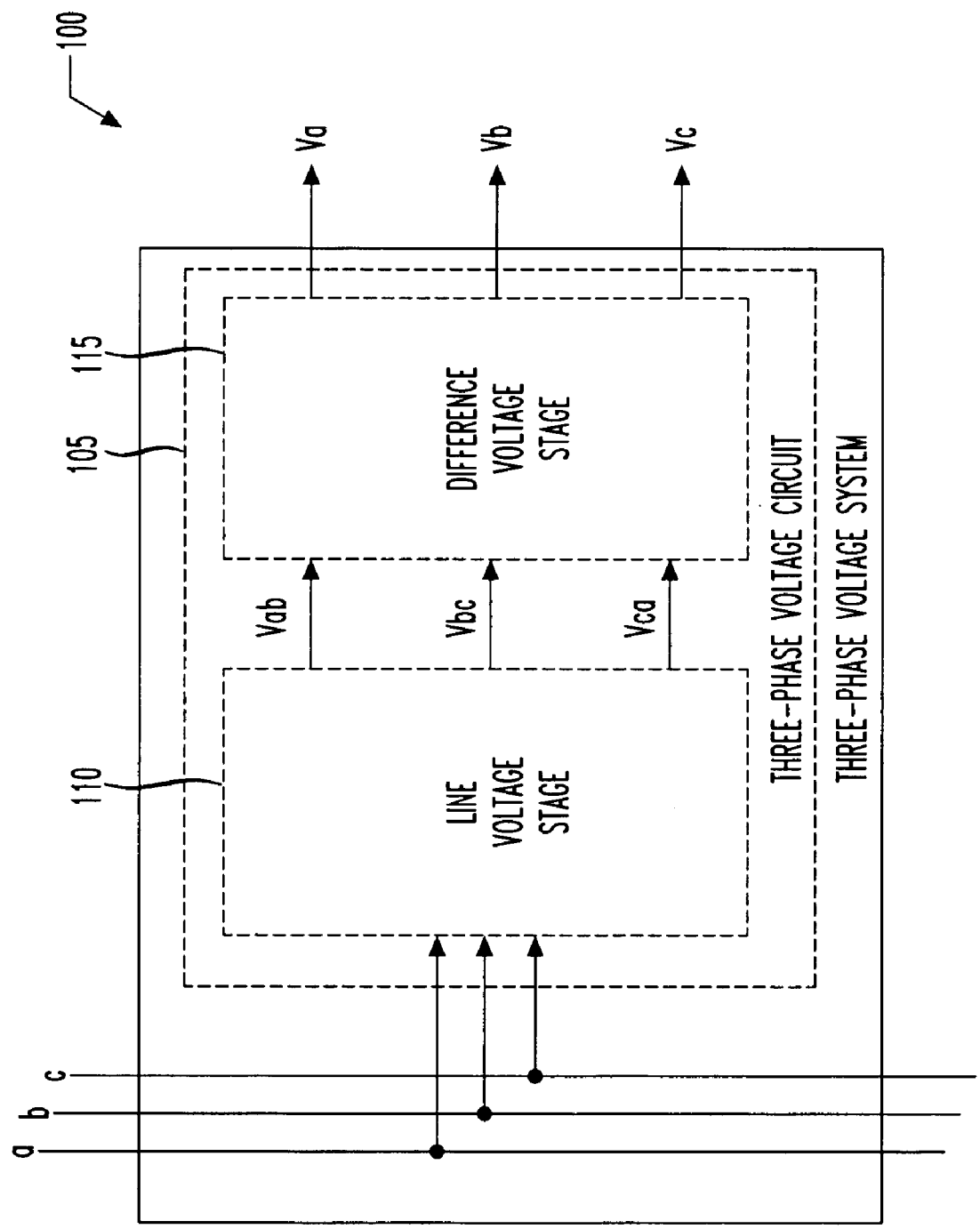
FIG. 1 illustrates a system diagram of an embodiment of a three-phase voltage system constructed in accordance with the principles of the present invention.

Referring initially to FIG. 1, illustrated is a system diagram of an embodiment of a three-phase voltage system, generally designated 100, constructed in accordance with the principles of the present invention. The three-phase voltage system 100 includes first, second and third input voltage lines a, b, c and a phase voltage circuit 105. The phase voltage circuit 105 includes a line voltage stage 110 and a difference voltage stage 115. The three input voltage lines a, b, c are without a neutral line.

The line voltage stage 110 is coupled to the first, second and third input voltage lines a, b, c and provides first, second and third line voltages Vab, Vbc, Vca. These three line voltages Vab, Vbc, Vca correspond to voltages measured between the first and second input voltage lines a, b, the second and third input voltage lines b, c and the third and first input voltage lines c, a, respectively. Additionally, the difference voltage stage 115 is coupled to the three line voltages Vab, Vbc, Vca and provides first, second and third phase voltages Va, Vb, Vc. The three phase voltages Va, Vb, Vc correspond to voltages that exist between a virtual neutral point and the three input voltage lines a, b, c, respectively.

The three-phase voltage system 100 may employ an implementation that utilizes hardware tailored to a specific application. Alternatively, an implementation may be employed using software that runs on a general purpose device such as a digital signal processor. Of course, an implementation may employ a combination of software and tailored hardware as appropriate to a particular application.

Figure 2:
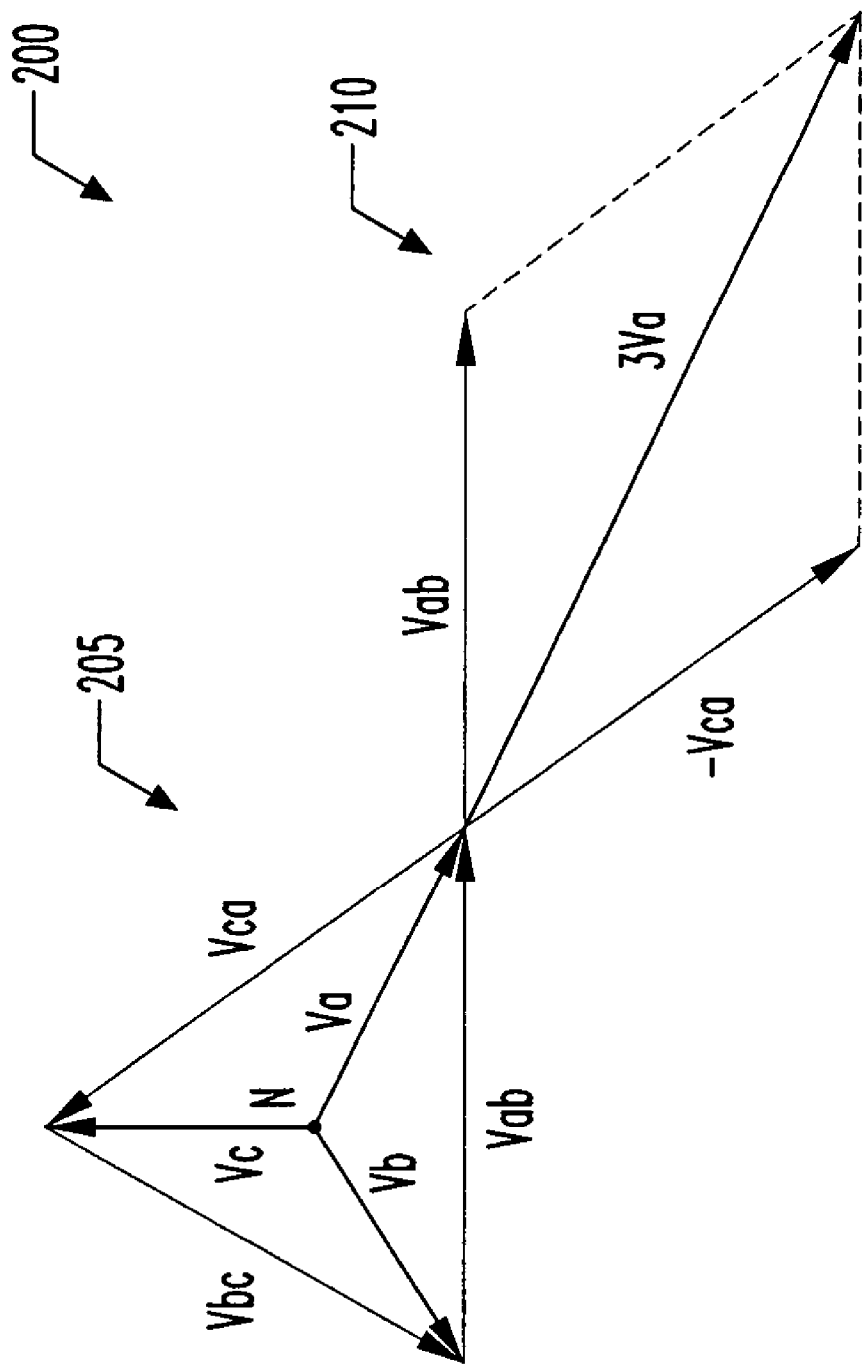
FIG. 2 illustrates a vector diagram showing exemplary line and phase voltage relationships that may be employed by the three-phase voltage system of FIG. 1.

Turning now to FIG. 2, illustrated is a vector diagram, generally designated 200, showing exemplary line and phase voltage relationships that may be employed by the three-phase voltage system 100 of FIG. 1. The vector diagram 200 includes an exemplary vector representation 205 relating to first, second and third line voltage vectors Vab, Vbc, Vca and first, second and third phase voltage vectors Va, Vb, Vc, emanating from a virtual neutral point N. The neutral point N resides in the center of a triangle formed by the three line voltage vectors Vab, Vbc, Vca when these voltages are equal in magnitude (indicating a symmetric, or balanced, AC line condition) and is off-center when these voltages are not equal in magnitude (indicating an asymmetric, or unbalanced, AC line condition).

As seen in an exemplary vector representation 205 of the vector diagram 200, the relationship between the line voltages and phase voltages may be expressed by:

$$Vab = Va - Vb, \tag{1a}$$

$$Vbc = Vb - Vc, \text{ and} \tag{1b}$$

$$Vca = Vc - Va. \tag{1c}$$

Then, for a three-phase voltage system without a neutral connection:

$$Vab - Vca = (Va - Vb) - (Vc - Va), \tag{2}$$

$$= 3Va - (Va + Vb + Vc),$$

$$Vab - Vca = 3Va,$$

since Va+Vb+Vc should equal zero for a three-phase system not having a neutral line. Similarly, it may be shown that the following relationships are generally true for both balanced and unbalanced AC line conditions:

$$Va = (Vab - Vca)/3, \tag{3a}$$

$$Vb = (Vbc - Vab)/3, \text{ and} \tag{3b}$$

$$Vc = (Vca - Vbc)/3, \tag{3a}$$

It is readily seen that dividing the difference in line voltages by a scaling factor of three allows an exact equivalence between a phase voltage and its associated line voltages. The vector diagram 200 also includes an exemplary vector representation 210 illustrating equation (3a).

Figure 3:
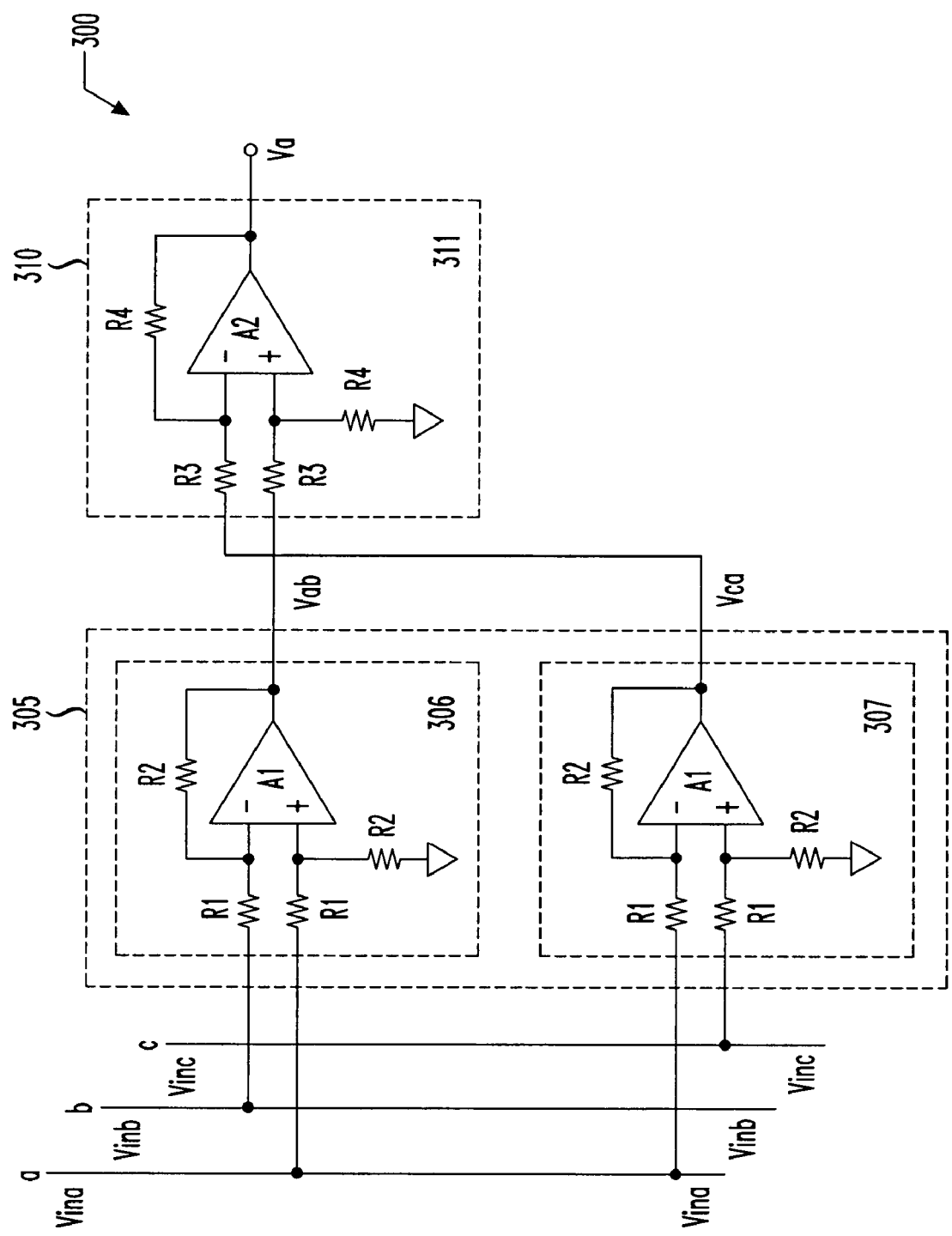
FIG. 3 illustrates a circuit diagram of an embodiment of a phase voltage circuit constructed in accordance with the principles of the present invention.

Turning now to FIG. 3, illustrated is a circuit diagram of an embodiment of a phase voltage circuit, generally designated 300, constructed in accordance with the principles of the present invention. The phase voltage circuit 300 includes a line voltage stage 305 and a difference voltage stage 310 and provides a phase voltage Va. The line voltage stage 305 is coupled to first, second and third input voltage lines a, b, c (which lack a neutral line). The first, second and third input voltage lines a, b, c provide first, second and third input voltages Vina, Vinb, Vinc, respectively. The three input voltages Vina, Vinb, Vinc are referenced to a common ground that forms a reference point within the phase voltage circuit 300. The line voltage stage 305 includes first and second line voltage differential amplifiers 306, 307 that provide first and second line voltages Vab, Vca, respectively. The difference voltage stage 310 includes a phase voltage differential amplifier 311 coupled to the first and second line voltage differential amplifiers 306, 307.

Each of the first and second line voltage differential amplifiers 306, 307 includes two sets of first and second resistors R1, R2 and an operational amplifier A1 having inverting and non-inverting inputs. The first line voltage differential amplifier 306 provides the first line voltage Vab by subtracting the second input voltage Vinb from the first input voltage Vina. Similarly, the second line voltage differential amplifier 307 provides the second line voltage Vca by subtracting the first input voltage Vina from the third input voltage Vinc. The first and second line voltage differential amplifiers 306, 307 employ first and second resistors R1, R2 to determine a line voltage scaling factor R1/R2. This line voltage scaling factor R1/R2 may be employed to scale the output levels of the first and second line voltages Vab, Vca, as appropriate to a particular application.

The phase voltage differential amplifier 311 include two sets of third and fourth resistors R3, R4 and an operational amplifier A2 having inverting and non-inverting inputs. The phase voltage differential amplifier 311 provides the phase voltage Va by subtracting the second line voltage Vca from the first line voltage Vab to yield a difference. The phase voltage differential amplifier 311 employs the third and fourth resistors R3, R4 to determine a phase voltage scaling factor R3/R4. This phase voltage scaling factor R3/R4 may be employed to scale (for example, divide) the difference between the first line voltage Vab and the second line voltage Vca as appropriate to the particular application. Therefore, the phase voltage circuit 300 provides a scalable realization of equation (3a) and may be employed for both balanced and unbalanced AC line conditions.

Figure 4:
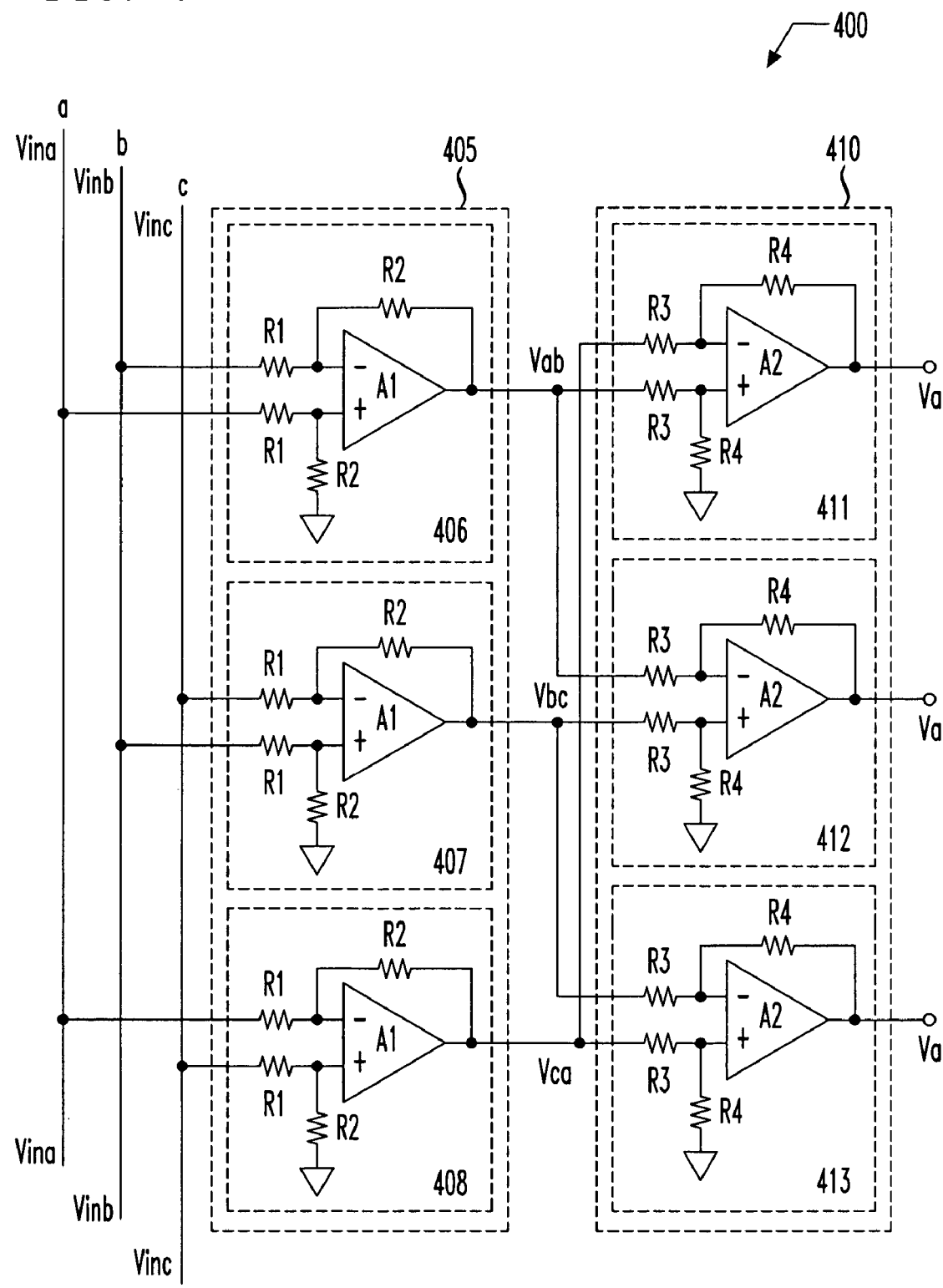
FIG. 4 illustrates a circuit diagram of an embodiment of a three-phase voltage system constructed in accordance with the principles of the present invention.

Turning now to FIG. 4, illustrated is a circuit diagram of an embodiment of a three-phase voltage system, generally designated 400, constructed in accordance with the principles of the present invention. The three-phase voltage system 400 may be employed as an implementation of the three-phase voltage system 100 introduced in FIG. 1. The three-phase voltage system 400, provides outputs of first, second and third phase voltages Va, Vb, Vc and includes three input voltage lines a, b, c that do not employ a neutral line, a line voltage stage 405 and a difference voltage stage 410. The line voltage stage 405 includes first, second and third line voltage differential amplifiers 406, 407, 408, that provide first, second and third line voltages Vab, Vbc, Vca, respectively. The difference voltage stage 410 includes first, second and third phase voltage differential amplifiers 411, 412, 413, that provide the first, second and third phase voltages Va, Vb, Vc, respectively.

Each of the first, second and third line voltage differential amplifiers 406, 407, 408 includes two sets of first and second resistors R1, R2 and an operational amplifier A1 having inverting and non-inverting inputs. The first line voltage differential amplifier 406 provides the first line voltages Vab by subtracting a second input voltage Vinb from a first input voltage Vina. The second line voltage differential amplifier 407 provides the second line voltage Vbc by subtracting a third input voltage Vinc from the second input voltage Vinb. And, the third line voltage differential amplifier 408 provides the third line voltage Vbc by subtracting the first input voltage Vina from the third input voltage Vinc. A line voltage scaling factor R1/R2 may be employed to scale these differences in input voltages as appropriate to an application.

Each of the first, second and third phase voltage differential amplifiers 411, 412, 413 includes two sets of third and fourth resistors R3, R4 and an operational amplifier A2 having inverting and non-inverting inputs. The first phase voltage differential amplifier 411 provides the first phase voltage Va by subtracting the third line voltage Vca from the first line voltage Vab. The second phase voltage differential amplifier 412 provides the second phase voltage Vb by subtracting the first line voltage Vab from the second line voltage Vbc. And, the third phase voltage differential amplifier 413 provides the third phase voltage Vc by subtracting the second line voltage Vbc from the third line voltage Vca. A phase voltage scaling factor R3/R4 may be employed to divide these line voltage differences as appropriate to an application. Of course, an overall scaling factor of (R1/R2)*(R3/R4) equal to three provides phase voltage magnitudes that accurately represent the line voltage magnitudes.

Figure 5:
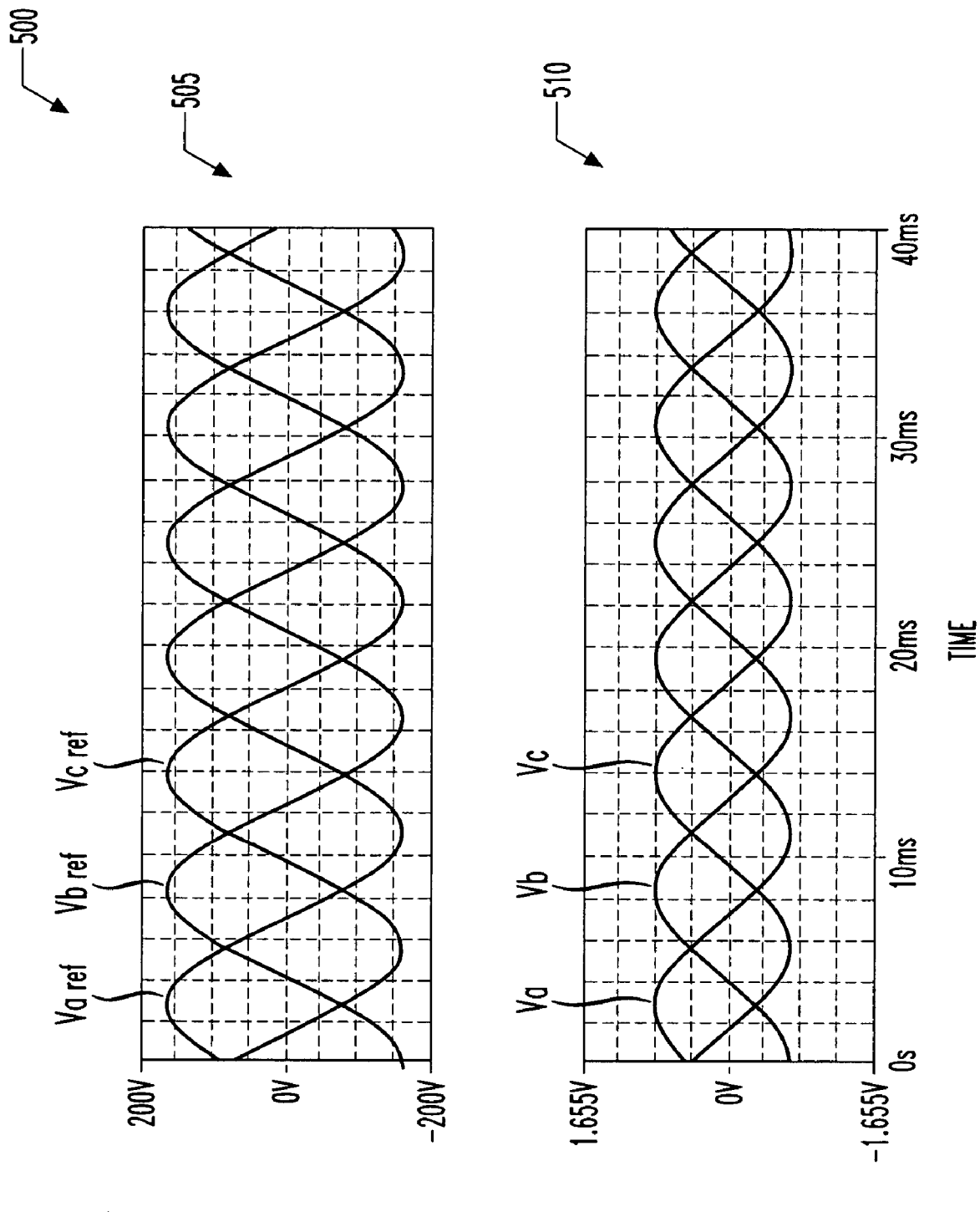
FIG. 5 illustrates representative waveforms for a symmetric AC condition associated with a three-phase voltage system constructed in accordance with the principles of the present invention.

Turning now to FIG. 5, illustrated are representative waveforms for a symmetric AC condition, generally designated 500, associated with a three-phase voltage system constructed in accordance with the principles of the present invention. The representative waveforms 500 include reference phase voltage waveforms 505 and recovered phase voltage waveforms 510. The reference phase voltage waveforms 505 include first, second and third reference phase voltages $Va_{ref}$, $Vb_{ref}$, $Vc_{ref}$ that may be associated with first, second and third voltage lines (such as those discussed with respect to FIGS. 1 and 4) that do not employ a neutral line. The recovered phase voltage waveforms 510 include corresponding first, second and third recovered phase voltages Va, Vb, Vc, respectively, that represent the phase voltage outputs discussed with respect to FIGS. 1 and 4. As may be seen in FIG. 5, the recovered phase voltage waveforms 510 bear a close correlation to the symmetrical reference phase voltage waveforms 505. As also seen, a scaling factor has been applied to the recovered phase voltage waveforms 510, thereby allowing a requirement associated with their application to be met.

Figure 6:
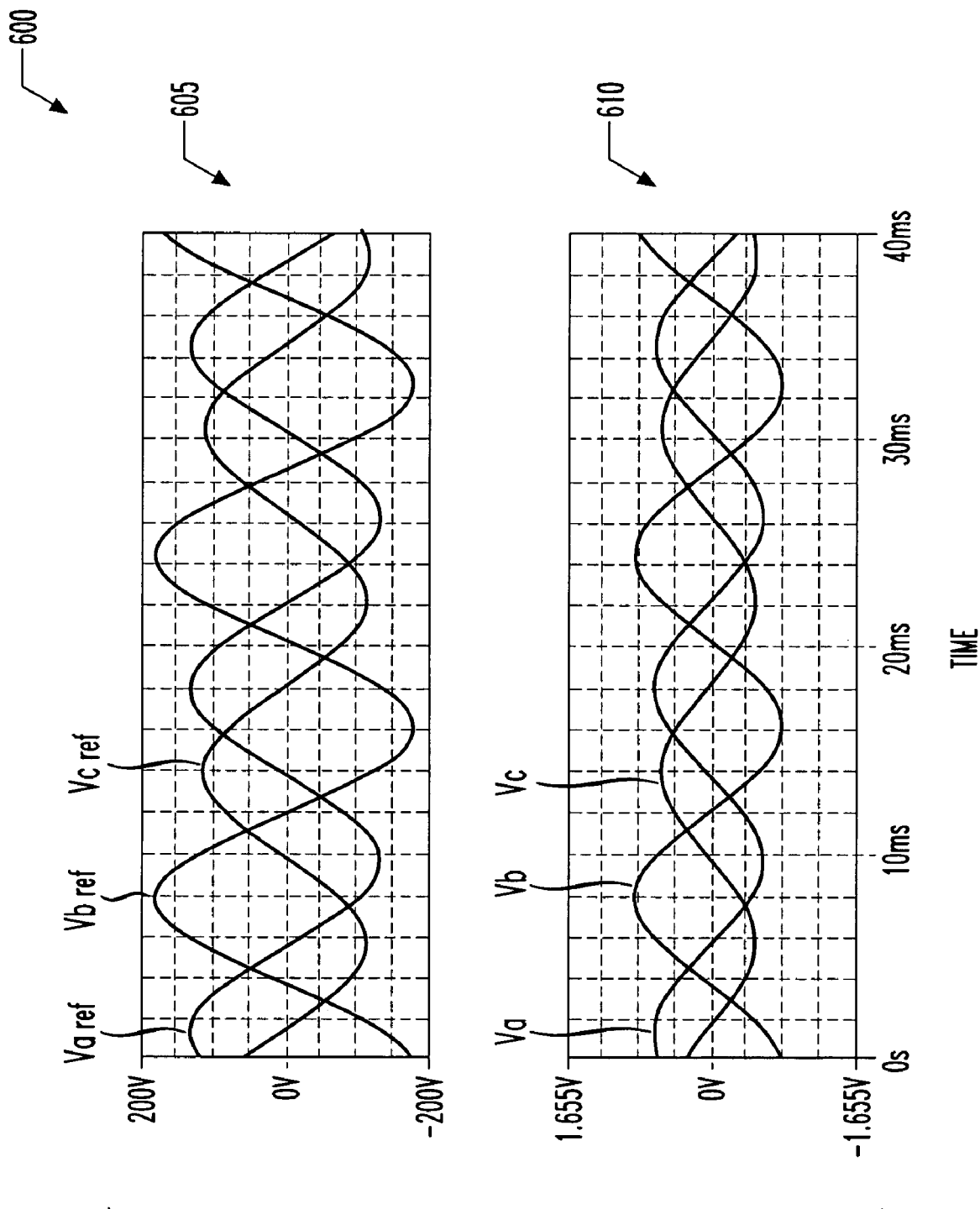
FIG. 6 illustrates representative waveforms for an asymmetric AC condition associated with a three-phase voltage system constructed in accordance with the principles of the present invention.

Turning now to FIG. 6, illustrated are representative waveforms for an asymmetric AC condition, generally designated 600, associated with a three-phase voltage system constructed in accordance with the principles of the present invention. The representative waveforms 600 include reference phase voltage waveforms 605 and corresponding recovered phase voltage waveforms 610. The reference phase voltage waveforms 605 include first, second and third reference phase voltages $Va_{ref}$, $Vb_{ref}$, $Vc_{ref}$ that employ differing amplitudes and may be associated with first, second and third voltage lines that do not employ a neutral line, as discussed before. The recovered phase voltage waveforms 610 include corresponding respective first, second and third recovered phase voltages Va, Vb, Vc. Again, as may be seen in FIG. 6, the scaled and recovered phase voltage waveforms 610 closely correlate in phase and relative amplitude with the asymmetrical reference phase voltage waveforms 605.

In summary, embodiments of the present invention directed to a phase voltage circuit, a method of providing at least one phase voltage and a phase voltage system employing a plurality of phase voltages have been presented. Advantages include the ability to recover associated phase voltages from voltage lines that do not employ a neutral line, even under asymmetric AC conditions. Additionally, the recovered phase voltages may be scaled by a factor equaling the number of phases to provide an accurate phase voltage representation of the associated input voltage lines.

Although the present invention has been described in detail, those skilled in the art should understand that they can make various changes, substitutions and alterations herein without departing from the spirit and scope of the invention in its broadest form.

What is claimed is:

1. A phase voltage circuit, comprising:
    a line voltage stage, coupled to at least three input voltage lines, configured to provide at least two corresponding line voltages, wherein:
        a first corresponding line voltage of at least two corresponding line voltages is a function of a comparison between a first input voltage line and a second input voltage line of said at least three input voltage lines, and
        a second corresponding line voltage of said at least two corresponding line voltages is a function of a comparison between said first input voltage line and a third input voltage line of said at least three input voltage lines; and
    a difference voltage stage, coupled to said line voltage stage, configured to provide at least one phase voltage, wherein each at least one phase voltage is derived from said at least two corresponding line voltages.

2. The circuit as recited in claim 1 wherein said at least three input voltage lines lack a neutral line.

3. The circuit as recited in claim 1 wherein said line voltage stage comprises two differential amplifiers.

4. The circuit as recited in claim 3 wherein a first of said two differential amplifiers provides a first line voltage by subtracting a second input voltage from a first input voltage and a second of said two differential amplifiers provides a second line voltage by subtracting said first input voltage from a third input voltage.

5. The circuit as recited in claim 1 wherein said difference voltage stage comprises one differential amplifier.

6. The circuit as recited in claim 1, wherein said differential amplifier provides a phase voltage by:
    subtracting a second line voltage from a first line voltage to yield a difference; and
    scaling the difference by a scaling factor.

7. The circuit as recited in claim 1 wherein said line voltage stage and said difference voltage stage employ a common reference point.

8. A method of providing at least one phase voltage, comprising:
    initially providing at least two corresponding line voltages from at least three input voltage lines; wherein:
        a first corresponding line voltage of said at least two corresponding line voltages is a function of a comparison between a first input voltage line and a second input voltage line of said at least three input voltage lines; and
        a second corresponding line voltage of the at least two corresponding line voltages is a function of a comparison between said first input voltage line and a third input voltage line of said at least three input voltage lines; and subsequently providing said at least one phase voltage from said at least two corresponding line voltages, wherein said providing of said at least one phase voltage is carried out with at least one differential amplifier.

9. The method as recited in claim 8 wherein said at least three input voltage lines lack a neutral line.

10. The method as recited in claim 8 wherein said providing of said at least two corresponding line voltages is carried out with at least two differential amplifiers.

11. The method as recited in claim 10 wherein said providing of said at least two corresponding line voltages comprises:
    employing a first of said two differential amplifiers to provide a first line voltage by subtracting a second input voltage from a first input voltage; and
    employing a second of said two differential amplifiers to provide a second line voltage by subtracting said first input voltage from a third input voltage.

12. The method as recited in claim 8 wherein said providing of said at least one phase voltage is carried out with at least one differential amplifier.

13. The method as recited in claim 8, wherein said differential amplifier provides a phase voltage by:
    subtracting a second line voltage from a first line voltage to yield a difference; and
    scaling said difference by a scaling factor.

14. The method as recited in claim 8 wherein said providing of said at least two corresponding line voltages and said providing of said at least one phase voltage are carried out employing a common reference point.

15. A phase voltage system for measuring three-phase voltages, comprising:
    three input voltage lines; and
    a phase voltage circuit, including:
        a line voltage stage, coupled to said three input voltage lines, that provides three corresponding line voltages, wherein:
            a first corresponding line voltage of said at least two corresponding line voltages is a function of a comparison between a first input voltage line and a second input voltage line of said at least three input voltage lines; and
            a second corresponding line voltage of the said least two corresponding line voltages is a function of a comparison between said first input voltage line and a third input voltage line of said at least three input voltage lines; and
        a difference voltage stage, coupled to said line voltage stage, that provides three corresponding phase voltages from said three corresponding line voltages, wherein said difference voltage stage comprises at least one differential amplifier.

16. The system as recited in claim 15 wherein said at least three input voltage lines lack a neutral line.

17. The system as recited in claim 15 wherein said line voltage stage has three differential amplifiers.

18. The system as recited in claim 17 wherein a first of said three differential amplifiers provides a first line voltage by subtracting a second input voltage from a first input voltage, a second of said three differential amplifiers provides a second line voltage by subtracting a third input voltage from said second input voltage and a third of said three differential amplifiers provides a third line voltage by subtracting said first input voltage from said third input voltage.

19. The system as recited in claim 15 wherein said difference voltage stage has three differential amplifiers.

20. The system as recited in claim 19 wherein,
    a first of said three differential amplifiers provides a first phase voltage by subtracting a third line voltage from a first line voltage to yield a first difference, and
    scaling said first difference by a scaling factor;
    wherein a second of said three differential amplifiers provides a second phase voltage by
    subtracting said first line voltage from a second line voltage to yield a second difference, and scaling said second difference by said scaling factor; and
    wherein a third of said three differential amplifiers provides a third phase voltage by
    subtracting said second line voltage from said third line voltage to yield a third difference, and scaling said third difference by said scaling factor.

21. The system as recited in claim 15 wherein said line voltage stage and said difference voltage stage employ a common ground.

* * * * *